United States Patent [19]
Atkins et al.

[11] Patent Number: 5,570,032
[45] Date of Patent: Oct. 29, 1996

[54] WAFER SCALE BURN-IN APPARATUS AND PROCESS

[75] Inventors: Glen G. Atkins; Michael S. Cohen, both of Boise; Karl H. Mauritz, Eagle; James M. Shaffer, Boise, all of Id.

[73] Assignee: Micron Technology, Inc., Boise, Id.

[21] Appl. No.: 108,097

[22] Filed: Aug. 17, 1993

(Under 37 CFR 1.47)

[51] Int. Cl.$^6$ ........................................ G01R 1/06
[52] U.S. Cl. .................. 324/760; 324/755; 324/765
[58] Field of Search .................... 324/158 F, 158 P, 324/72.5, 731, 760, 765, 755; 437/8; 165/80.3, 80.4, 80.5; 439/68, 70

[56] References Cited

U.S. PATENT DOCUMENTS

| | | | |
|---|---|---|---|
| 3,963,985 | 6/1976 | Geldermans | 324/754 |
| 4,899,107 | 2/1990 | Corbett et al. | 324/158 R |
| 4,968,931 | 11/1990 | Littlebury et al. | 324/158 F |
| 5,010,296 | 4/1991 | Okada et al. | 324/158 F |
| 5,034,685 | 7/1991 | Leedy | 324/158 F |
| 5,034,688 | 7/1991 | Moulene et al. | 324/760 |
| 5,123,850 | 6/1992 | Elder et al. | 439/67 |
| 5,198,752 | 3/1993 | Miyata et al. | 324/158 F |
| 5,198,753 | 3/1993 | Hamburgen | 324/158 F |
| 5,210,485 | 5/1993 | Kreiger et al. | 324/158 F |
| 5,302,891 | 4/1994 | Wood et al. | 324/765 |
| 5,325,052 | 6/1994 | Yamashita | 324/760 |
| 5,342,807 | 8/1994 | Kinsman et al. | 437/209 |

*Primary Examiner*—Vinh P. Nguyen
*Attorney, Agent, or Firm*—Trask, Britt & Rossa

[57] ABSTRACT

An apparatus for wafer scale burn-in and testing of semiconductor integrated circuits and a method for its utilization. A wafer is mated to a printed circuit board which electrically contacts the pads on each die using small conductive pillars. Single precise alignment of entire wafer within apparatus allows for testing all the dice on the wafer in parallel, eliminating need to probe each die individually. The apparatus is fitted with heating elements and cooling channels to generate the necessary wafer temperatures for burn-in and testing. The method of utilization eliminates processing of defective dice beyond burn-in and test, thereby increasing throughput.

17 Claims, 8 Drawing Sheets

5,570,032

WAFER SCALE BURN-IN APPARATUS AND PROCESS

FIELD OF THE INVENTION

This invention relates to semiconductor electronics, and more particularly, to efficient testing of integrated circuits prior to shipment by the manufacturer.

Specifically, this invention involves a method and an apparatus for wafer scale burn-in and testing.

BACKGROUND OF THE INVENTION

A number of integrated circuits are typically fabricated at the same time on a common slice of silicon or wafer. This wafer is usually substantially circular with a diameter of around 3 to 6 inches (7.5 to 15 cm). Once the fabrication process is complete, the wafer is then sliced-up into the individual integrated circuit (IC) chips or dice (singular: die) which are later packaged into modules or incorporated into larger systems.

This process of dividing a wafer into its individual dice involves scribing the wafer with grooves, then breaking the wafer along those grooves like pieces of a chocolate bar. Alternatively, the dice are cut from the wafer using a saw such as a laser. Sometimes, the entire dividing process is referred to as "scribing". When the dice are still connected as an integral wafer or separated but closely packed together as if they still were a wafer, the IC's are said to be in the wafer scale of development.

The steps taken to create a finished, packaged integrated circuit are exhaustive. Consequently, the earlier one can discover a faulty device the better. This device can then be thrown out of any further processing, thereby increasing throughput, saving time and money.

Most IC's that are going to fail before a reasonable lifetime, do so at an early stage. Therefore, these units may be screened out by running all the IC's for a time and then testing prior to shipment. This weeding out process can be hastened by elevating the temperature and applying voltages either statically or dynamically to the IC's. This process is called burn-in. In the past, this required placing the packaged IC module into a special oven or autoclave capable of applying the proper burn-in voltages or signals.

Since some IC's are designed or required to operate in a cooled environment, adequate testing may require special cooling apparatus. In the past, this involved placing the module to be tested inside a cooling chamber or employing highly specialized test equipment.

Often times, more than one IC is packaged in a single module called a Multi-Chip Module (MCM). In this case, burn-in and testing can be more difficult due to the greater complexity of the total circuitry. Also, the faulty module may need to be scrapped or repaired, both of which are time consuming. It is advantageous therefore, to burn-in and test IC's prior to packaging. Once this is feasible, as it now is using the invention, a chip fabricator can supply the MCM market with burned-in and tested dice.

Currently, there is no wafer scale burn-in capability in the industry. Since a single wafer contains hundreds or thousands of IC's held together in precise alignment, it would be desirable to take advantage of this situation for burn-in. With a single alignment of the wafer, it would be possible to burn-in and test all the dice in parallel. As with any wafer scale system, the close proximity of the dice to each other allows for greater speed and less power consumption.

Currently, wafer scale testing of IC's involves using a test probe. In a time consuming procedure, the probe must be precisely aligned with each die to be tested, one at a time. Since this testing is done prior to burn-in, the time spent testing a future failing die is wasted time. Currently, the efficiency of a test probe is limited by the number of contact pads it can engage at any one time.

The next logical step in miniaturization for the semiconductor electronics industry involves wafer scale integration. Basically, this means closely packing the dice used in a system so that they have the same density they enjoyed when they were connected as a wafer. The ability to burn-in and test an entire wafer would be invaluable in implementing this scheme effectively. This would also allow testing the circuitry while the dice are inter-connected and operating in concert.

FIG. 1 shows the steps involved in processing a fabricated wafer through shipment using the current state of the art process flow, with burn-in occurring after scribing and packaging. This of course applies to the typical manufacturer who ships packaged modules. Shipment can occur at any stage depending on what product or service the manufacturer or company provides.

Typically, the fabricated wafer is first tested 1 using a probe which tests selected portions of the wafer. If any portion is determined to have a repairable fault, repair is implemented by blowing fuses which activate redundant circuitry. Fuses are blown either by laser or electrical means, after which the wafer is retested.

The wafer is then scribed 2, thereby dividing the wafer into individual dice. The dice are attached and wire bonded to a leadframe, wherein each die is packaged 3 by encapsulation into a module. The leads of each module are trimmed, formed and soldered.

The finished modules are then sent to intelligent burn-in 4 and tested to eliminate infant mortalities. Intelligent burn-in is different from normal static or dynamic burn-in because it simulates an operating environment and tests the module during burn-in. The devices are then speed graded to discover their characteristics and tolerances, then categorized as to quality. For example, it may be worthy of military rather than commercial applications.

The modules are then sorted and marked 5, according to their quality and function, then finally tested 6 prior to shipment.

SUMMARY OF THE INVENTION

The principal and secondary objects of this invention are to provide a vessel which allows burn-in and testing of integrated circuits while those circuits are still at the wafer scale; and to provide a method utilizing wafer scale burn-in and testing to enhance through-put.

These and other objects are achieved by creating a vessel which allows attachment of a printed circuit board (PCB) to the top of the wafer. The PCB serves as an interface between the wafer and outboard equipment which will supply the necessary voltages and signals required during test and burn-in procedures. The PCB has a plurality of electrically conductive pillars protruding from its underside. These pillars are arranged so that tips of the pillars precisely contact the pads of the circuits on the wafer when the PCB and wafer are brought together.

Maintaining the PCB/wafer connection requires holding the wafer in a precise, non-permanent orientation with respect to the PCB, and applying the proper force, uniformly distributed across both the PCB and the wafer. This is accomplished by mounting the wafer onto a substantially planar carrier using an adhesive or other means. The carrier is mounted atop a first pressure-plate/heat sink and the PCB is mounted beneath a second pressure plate/heat sink. These two plates are brought precisely together, mating the PCB to the wafer, and providing adequate connection of pillars to pads.

To facilitate burn-in, the wafer is heated by a heating element built into the lower pressure plate/heat sink. To facilitate testing, the wafer is cooled by channels in the lower plate through which gaseous or liquid cooling media can be pumped.

The method of utilizing the vessel involves these steps:

choosing and cleaning the vessel;

mounting the wafer into the vessel;

initial testing and laser/electronic repair of the wafer;

performing intelligent burn-in;

scribing, sorting and marking;

packaging dice; and, final testing.

During the evaluative steps in the method such as initial testing (probing), post repair probing and post burn-in testing, a record is maintained on the performance of each die on the wafer. This record is called a wafer map. Depending on the application and the stage in manufacturing, the map can be used to laser scribe out defective dice, tab certain dice for more extensive testing or repair, and mark dice physically or in software according to their operating characteristics such as speed, leakage, and bit failures. Since the dice are all present and available in the vessel, many of these functions can be accomplished in parallel. The map is again used to sort the dice during extraction from the carrier.

DESCRIPTION OF THE PREFERRED EMBODIMENTS OF THE INVENTION

Figure 1:
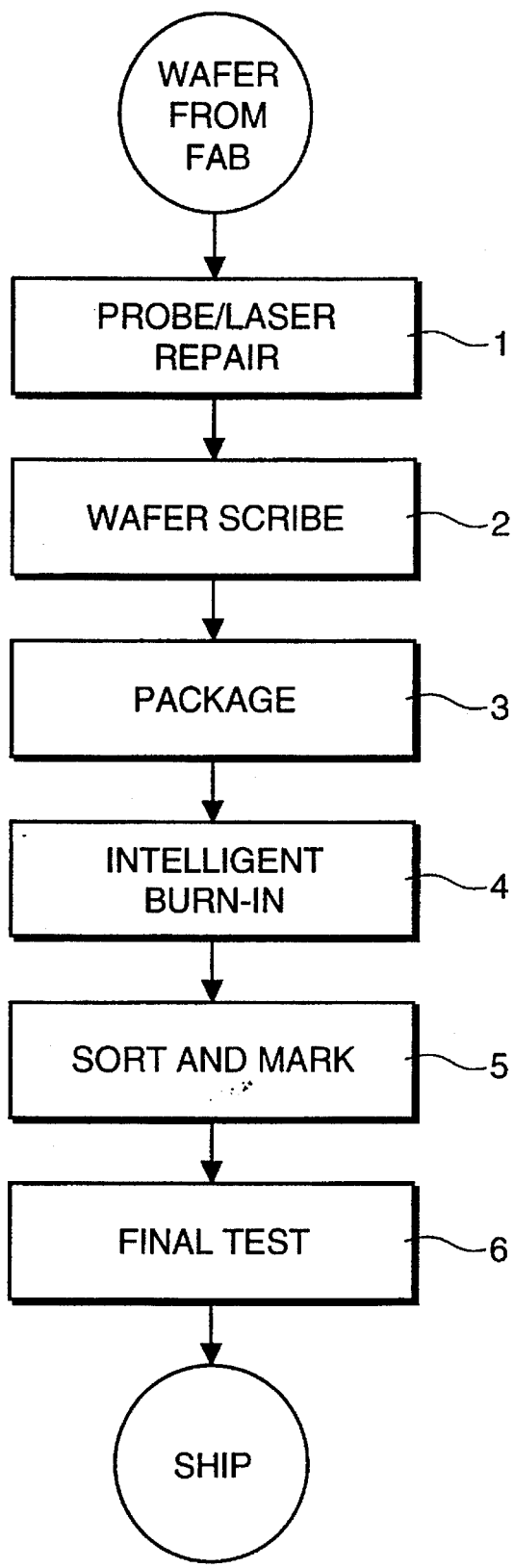
FIG. 1 is a flow diagram of the prior art processing steps in taking a wafer from fabrication to shipment.
Figure 2:
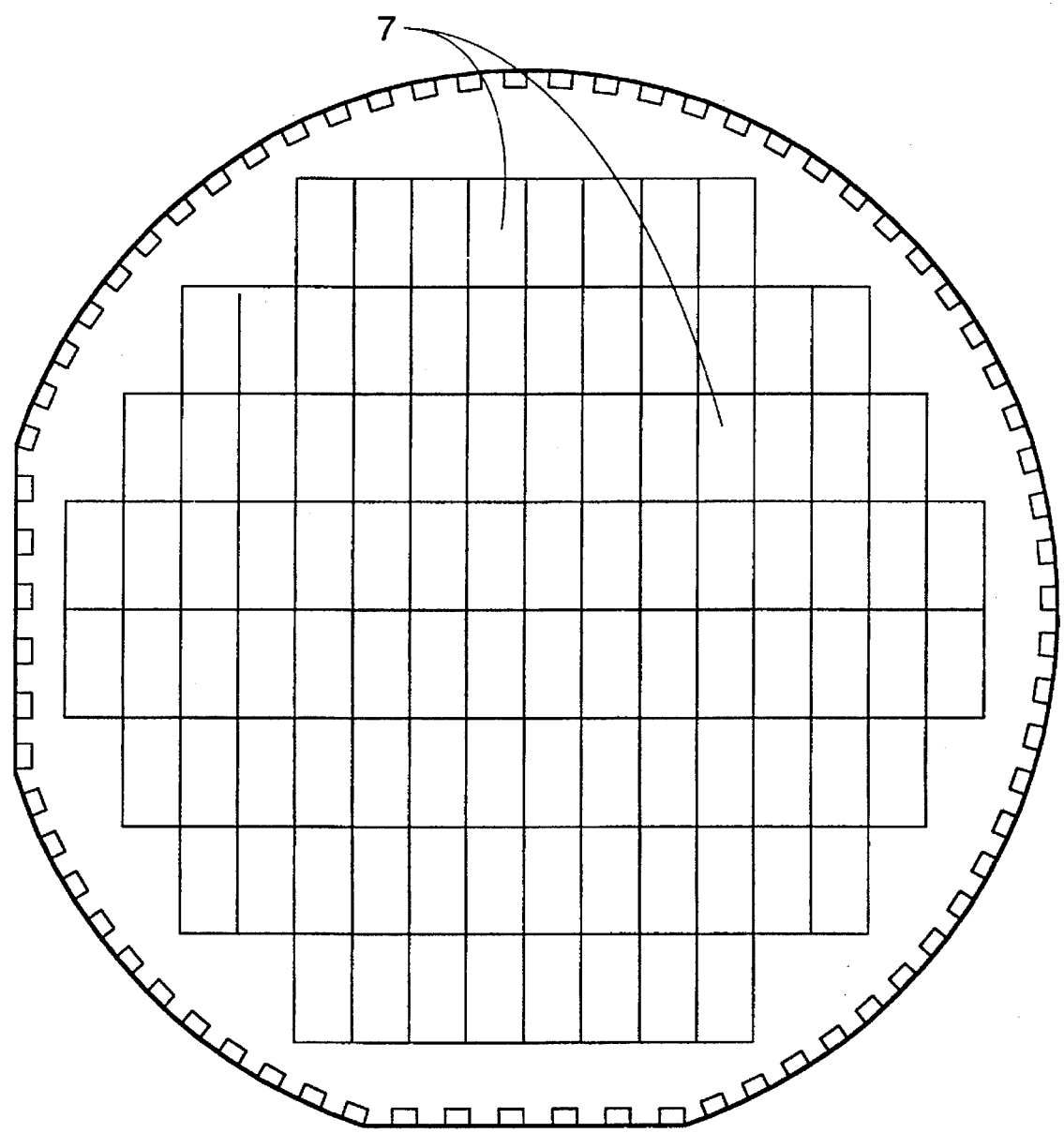
FIG. 2 is a plan view of a typical wafer showing individual die locations.
Figure 3:
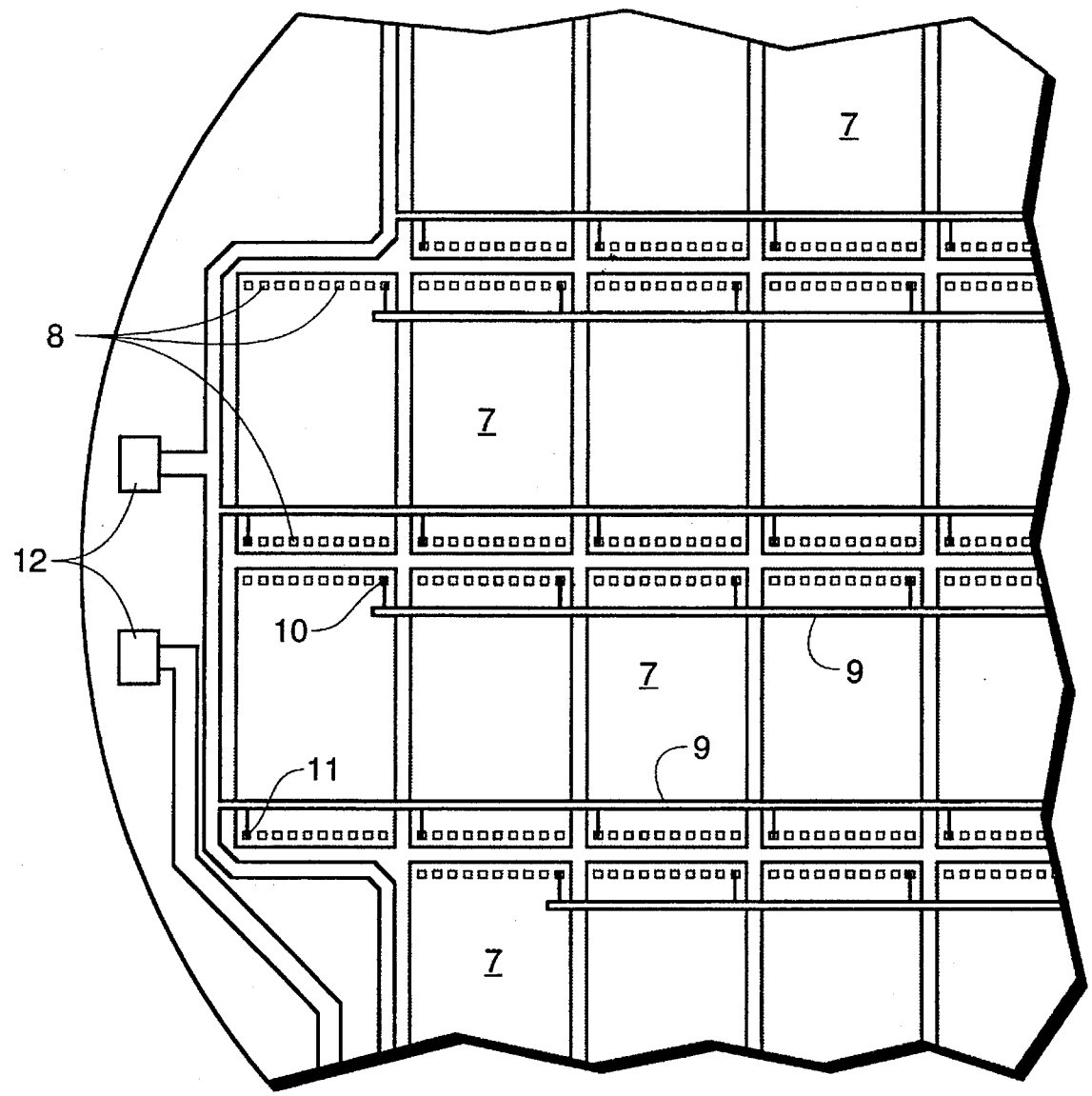
FIG. 3 is a zoomed-in plan view of a typical wafer.

Referring now to the drawing, FIG. 2 shows a typical circular semiconductor wafer after fabrication. The wafer comprises many closely packed integrated circuit chips or dice 7 which will eventually be separated from each other. FIG. 3 shows a blown-up portion of the wafer. Each individual die 7 has a number of contact pads 8 which are the electrical connection points for the circuit on that die.

Prior art wafer designs incorporated conductive test lines 9 fabricated onto the wafer itself. These lines connect the ground and power supply ports 10 and 11 on each die to relatively large, common contact pads 12 located around the periphery of the wafer. These large pads can be accessed by relatively imprecise test equipment during the probe and repair step described above in the prior art method for taking the IC's from wafer to shipment. Since the invention will connect directly to the smaller pads 8 on each die, the lines and large pads are no longer needed.

Figure 4:
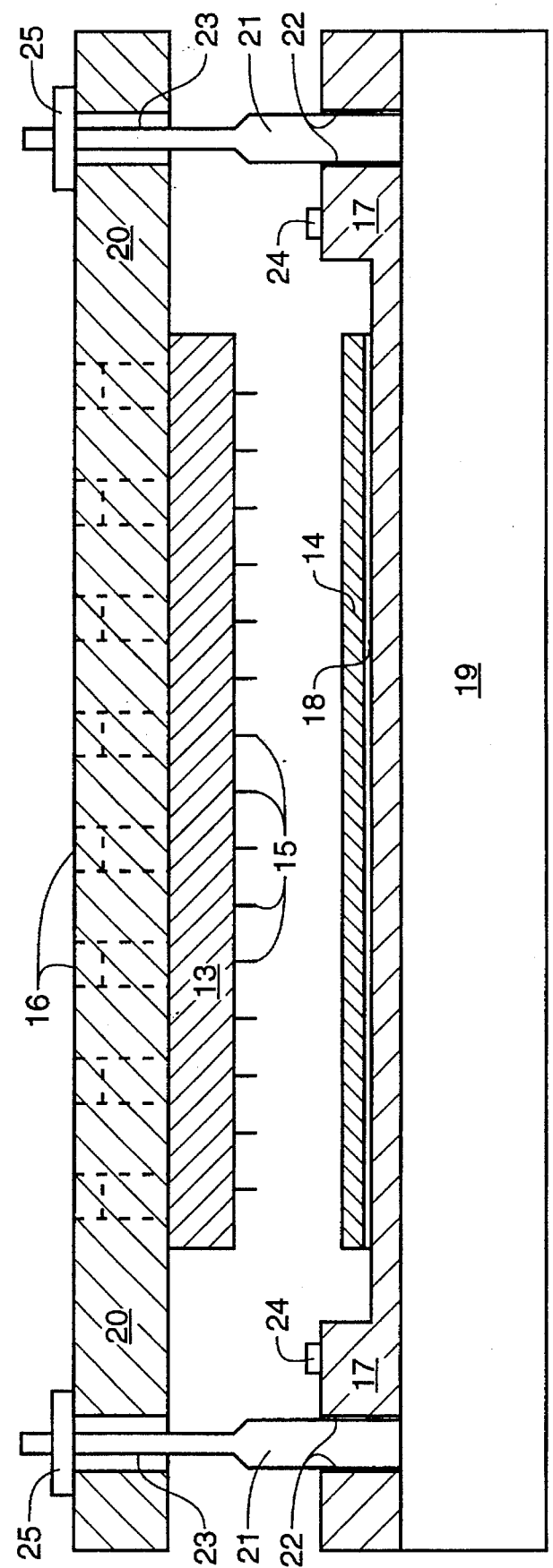
FIG. 4 is a vertical cross-section view of the vessel.

The entire wafer is loaded into a vessel, the cross-section of which is seen in FIG. 4. In general, the vessel serves to bring a printed circuit board (PCB) 13 into precise electrical contact with the dice pads on the wafer 14. Direct contact is made from PCB to wafer through a plurality of conductive pillars 15, one pillar per pad. Therefore, each die is independently routed via the pillars and traces of the PCB to connectors 16 which electronically connect the PCB and hence, the wafer to the outside world. Outboard test equipment can be connected to operate the PCB and wafer during test and burn-in. This allows each die to be independently tested at the device's operating speed, and allows all the dice on the entire wafer to be tested in parallel.

The optimum arrangement of the pillars and likewise the pads of a given die type may become an industry standard. Should some other standard be agreed upon, pillar arrangement can be modified to conform to that pad arrangement. It is anticipated that the pillars will be small and precise enough so that a PCB can be built having an overabundance of pillars arranged to engage a number of different standard pad arrangements. The excess pillars which do not contact any pads on a particular die can be deselected in software.

To secure its position, the wafer 14 is attached to the wafer saw carrier frame (carrier) 17 using an adhesive layer The carrier is then mounted to the upper side of a lower plate 19 which provides sturdy, rigid support for the carrier and acts as a heat sink, drawing heat away from the wafer during operation.

The PCB is attached to the underside of an upper pressure plate heat sink 20. The upper plate provides sturdy, rigid support for the PCB while acting as a heat sink as well. When the two plates are brought together, they provide a uniform compressing force across both the PCB and the wafer, thereby maintaining proper contact between them.

The position of the plates in relation to each other is maintained by the alignment guides 21 which are firmly attached to or integral with the lower plate. The alignment guides restrict lateral movement of the carrier by engaging holes 22 through the carrier. They also laterally align the upper plate to the lower plate by slidingly engaging holes 23 in the upper plate.

Vertical movement of the upper plate in the downward direction is restricted by spacers 24 attached to the lower plate that rest up against the exposed underside of the upper plate when the PCB and wafer are in proper contact with each other. Vertical movement in the upward direction is restricted by fasteners 25 attached to the alignment guides above the upper plate.

Some of the features of the vessel require more detailed description. First, the PCB can be constructed of polyimide, KEVLAR brand material, KAPTON brand material, or any similar material capable of withstanding burn-in and cold test environments. Also, depending on the application, the PCB may be constructed with multiple power and ground layers.

Figure 5:
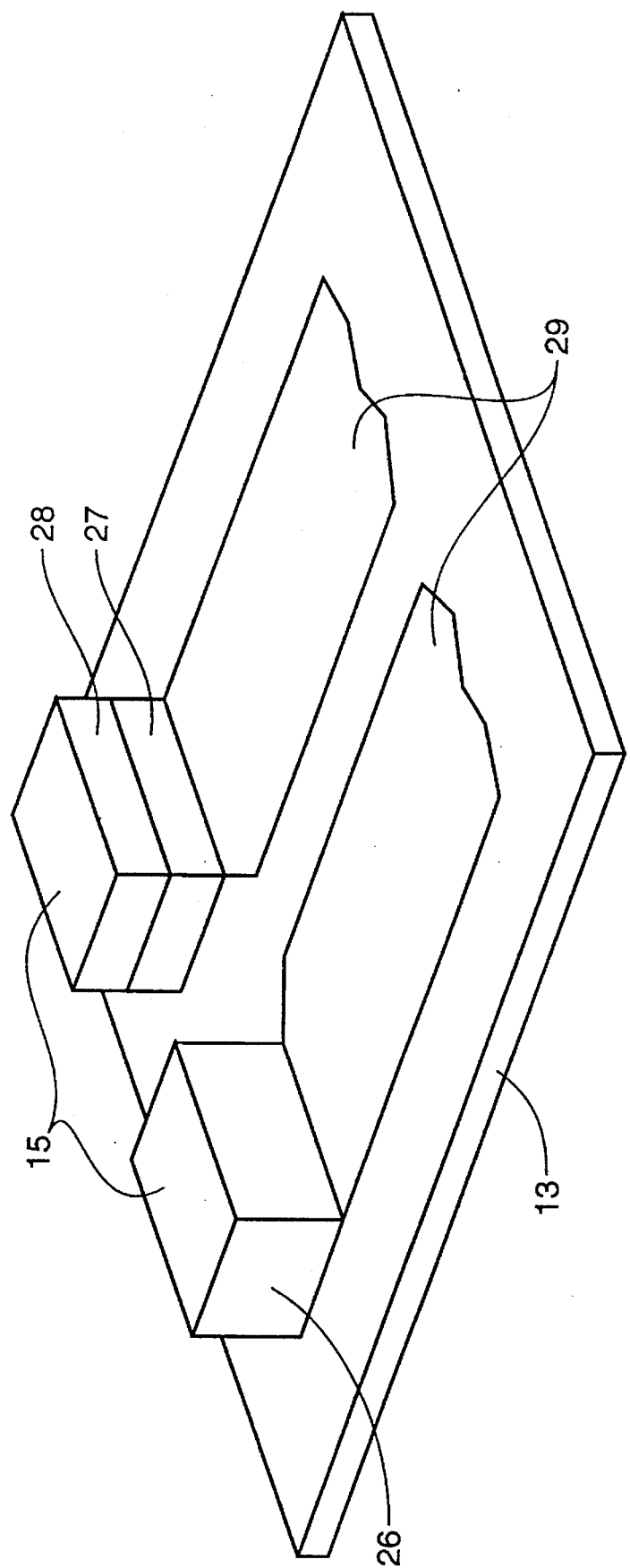
FIG. 5 is an inverted perspective view of a section of the underside of the printed circuit board with pillars extending upward.

FIG. 5 shows the PCB 13 in an inverted orientation with the conductive pillars 15 extending upward. The conductive pillars can be made of conductive polymer/epoxy as depicted by the first pillar 26 or a combination of metal bumping such as solder 27 and conductive polymer/epoxy 28. Also shown are conductive connection lines or traces 29 which are part of the PCB.

Since the pads on the wafer lie substantially within a horizontal plane, the ends of the pillars must be substantially planar to properly engage them. This can be achieved by freezing the pillars to a certain level of rigidity, then milling them down, or by melting the ends off using a mold of the proper height and tolerance. The height may have to be adjusted to allow for thermal expansion of the PCB and wafer. Furthermore, additional metal shavings may be placed in the polymer/epoxy before curing, thereby creating a wiping surface to remove metal oxides on the die pads when the PCB and wafer are mated.

The wafer is aligned optically with the carrier and placed by robot or other means. Since the carrier is already being used to precisely orient the wafer for scribing, the targeting features existing on the carrier may be used to optically align the wafer laterally and rotationally for mating with the PCB. The PCB itself contains a targeting feature or fiducial to precisely align it to the upper plate. Components of the vessel are constructed to such a tolerance that the carrier is already aligned with respect to the vessel.

Figure 6:
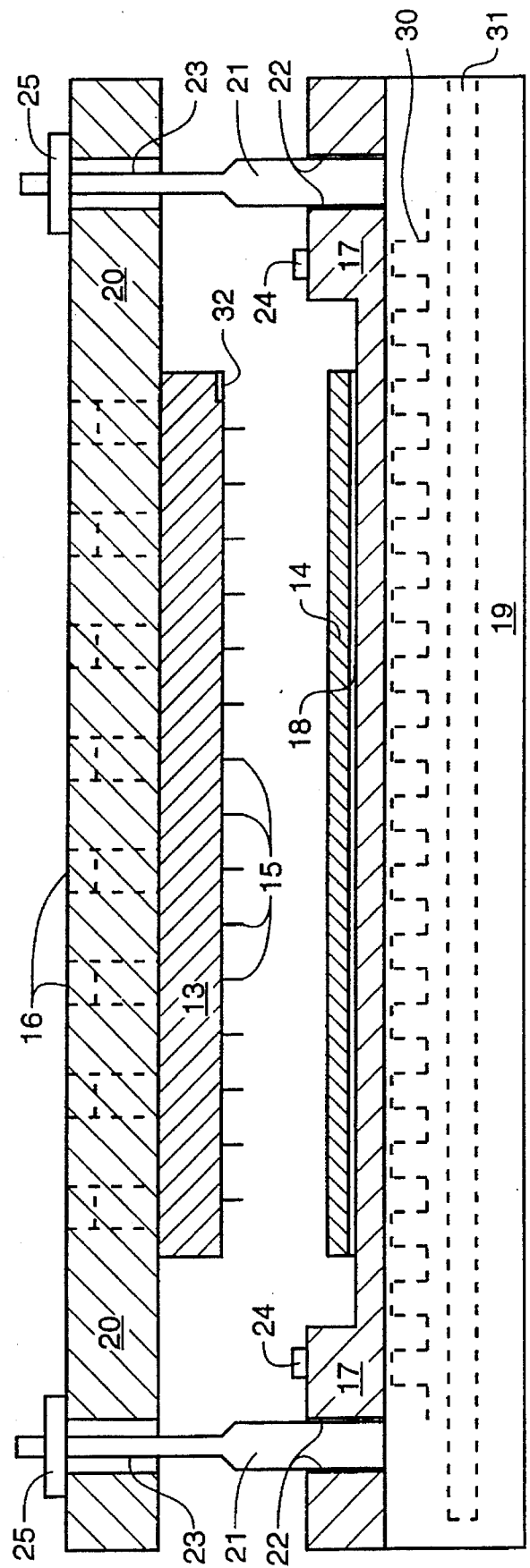
FIG. 6 is a vertical cross-section of the vessel showing heating element and cooling channel built into the lower plate.

FIG. 6 shows a heating element 30 incorporated in the lower plate, thereby making the vessel a stand alone miniature burn-in oven or autoclave. Cooling means may be realized by boring channels 31 in the lower plate through which gaseous or liquid cooling fluid can pass. External methods of heating and cooling may be used in lieu of, or in addition to these features. A thermal sensor 32 is incorporated into the vessel to monitor the wafer temperature.

Figure 7:
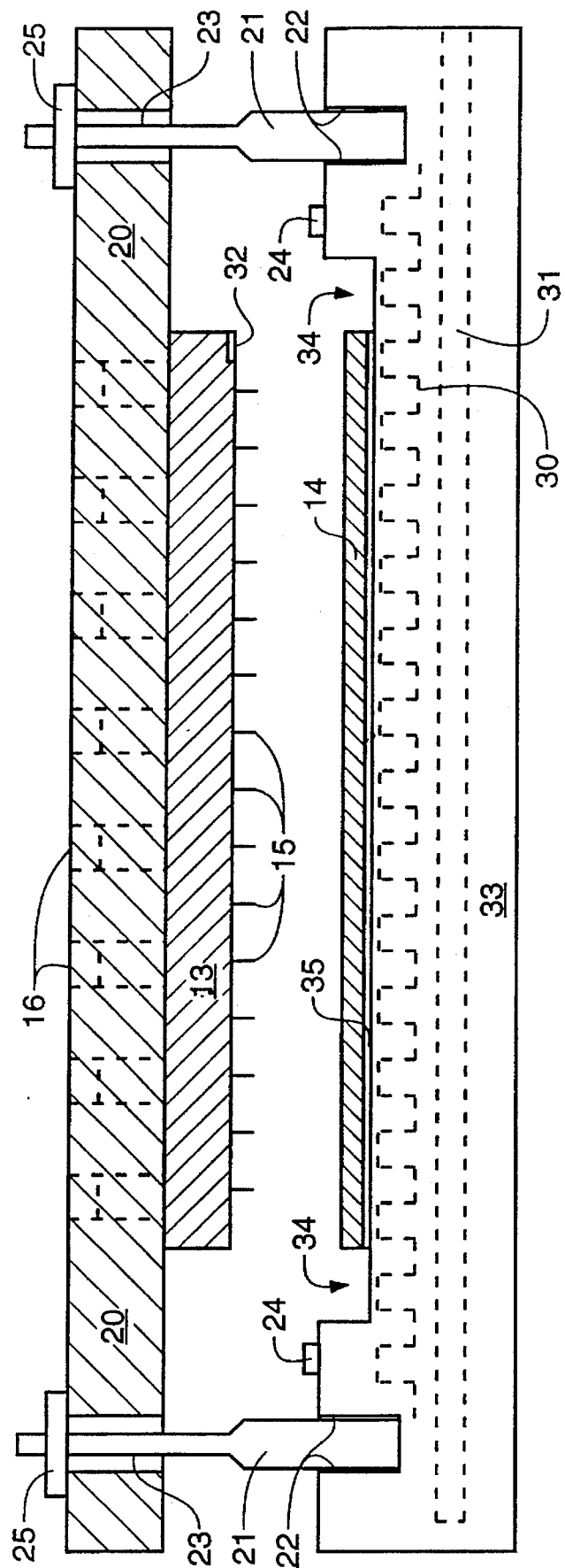
FIG. 7 is a vertical cross-section of the vessel where the wafer is attached directly to the lower plate, without using the wafer saw carrier frame.

FIG. 7 shows an alternative means for accurately aligning the wafer in the vessel by eliminating the wafer carrier and directly placing the wafer on the lower plate 33. Here, the upper surface of the plate has a recess 34 sized and dimensioned to hold the wafer and allow for its thermal expansion. This recess may also serve to mechanically align the wafer within the vessel.

The surface of the recess may be coated with a layer 35 of sticky tape or epoxy to provide more stable attachment of the wafer. Alternative attachment means, either mechanical or adhesive can be employed, however the attachment needs to remain intact and functional at temperatures in excess of 125 degrees C. and in cold temperatures around −55 degrees C. Also, adhesion should not be so strong as to cause difficulty in later removing scribed dice by vacuum pickup.

The vessel design should allow for removable/replaceable PCB boards. Depending on the application, type of wafer being worked on or the type of testing being done, different PCB's can be loaded into the vessel. For example, one PCB with reduced connections and controlling logic (microprocessors, multiplexers, etc.) might be used for initial or final probe, redundancy programming, pre-passivation test or any other fabrication or testing requirements. A PCB with no logic and several connectors might be used for burn-in. It is also possible to have the complete test electronics included in the PCB and/or vessel.

Figure 8:
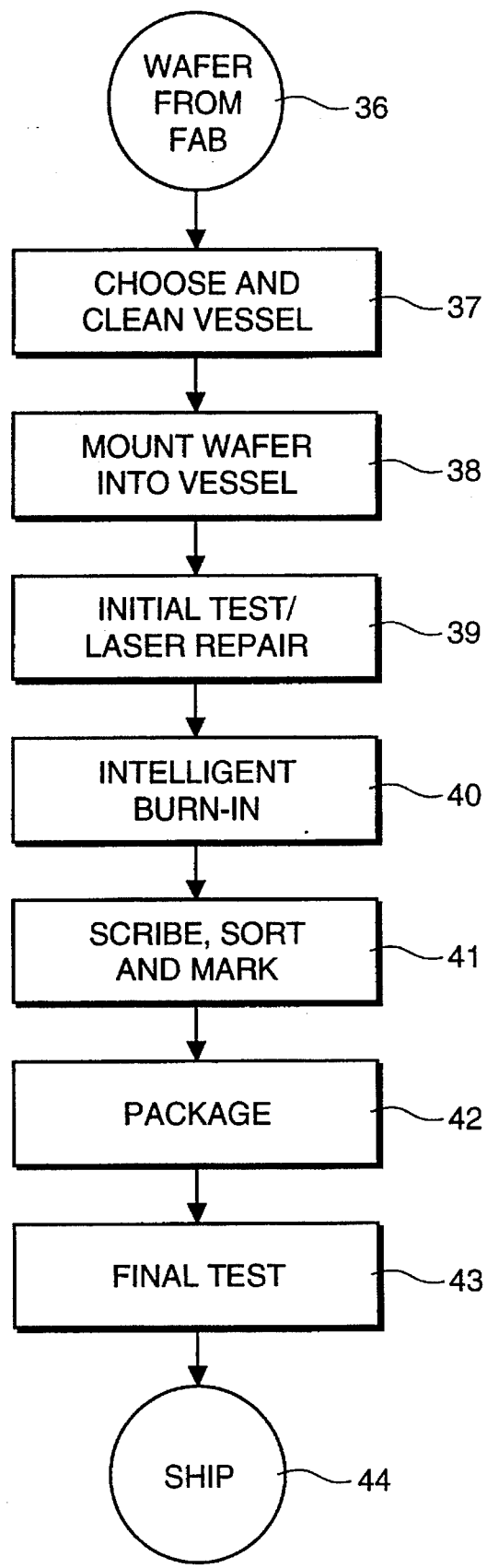
FIG. 8 is a flow diagram of the processing steps in taking a wafer from fabrication to shipment using the invention.

The true worth of the vessel is realized and its potential utilized in a new method of wafer scale burn-in and testing. FIG. 8 shows this method in taking a fabricated wafer through to module shipment.

Wafers arrive from fabrication 36 typically in a wafer boat. The wafer serial number is read to determine the device type. A vessel appropriate to the device type is selected and cleaned 37 if necessary to remove any contaminants that accumulated from previous use. An adhesive is then applied to the recess in the vessel's lower plate where the wafer will be placed. The wafer is removed from its boat by vacuum arm and placed onto the lower plate. The upper plate is aligned to the lower, and the plates are brought together, thereby mounting the wafer to the vessel 38. The wafer serial number is recorded either optically or electronically along with the vessel serial number and loaded into the test software for development of the wafer map.

The completed vessel is place in a queue leading to initial test 39. The queue may comprise conveyor belts, automated carts or racks that allow transport of the vessel to probe apparatus, whereupon the vessel is mounted within the apparatus and electrically connected. The interfacing circuitry can perform all tests currently accomplished by probe involving wafer repair and parametrics. The vessel can be reopened for laser repair, or remain closed for electrical repair which is done by routing control signals through the existing interface circuitry. Upon completion of repairs, coded information acquired during initial test regarding bit failures, parametrics such as power consumption, pin leakages and other basic funtionality and speed grade is recorded in the wafer map in software. The vessel is then placed in a queue for burn-in and testing.

The vessel is then mounted and connected to a burn-in and test system which makes use of wafer map information such as device types, defective elements, bits, etc., to accomplish intelligent burn-in and test 40. The system provides the electronic interconnect necessary to test individual devices along with power for the vessel's heating elements and supply for the vessel's cooling channels. Intelligent, environmental stress testing is performed with the tester supplying stimuli and adjusting the vessel temperature. When computerized failure analysis has determined that a sufficient burn-in has been achieved, the vessel is returned to ambient temperature, removed from the system, and placed in the queue for scribing.

The vessel is then mounted and connected to a scribe and singulation system 41. The vessel is opened, the wafer scribed and marked, and the devices removed and placed in sorted bins according to the wafer map information. If the final product is to be packaged 42, the devices can be sent to be attached and wirebonded or tabbed to a lead frame, encapsulated, trimmed and formed, soldered, then finally tested 43 and shipped 44. Otherwise, the bare dice may be sent through the appropriate containment processes to prevent contamination during shipment.

Test results of each vessel are placed in a separate database that monitors vessel performance. The database is analyzed to determine whether the vessel has developed any problems requiring either repair or replacement.

Prior to mating the wafer with the vessel, the wafer may be semi-scribed or scored along the die boundaries. This scribing is not done to the degree where it would jeopardize the mechanical integrity of the wafer and thus the alignment of the wafer pads to the PCB. However, since any scribing is a rigorous and stressful procedure, it does reveal those problems which can occur in the circuits due to full-scribing. These problems can be detected by subsequent testing or the inadequate mating of the wafer and PCB.

At any time during the process after a testing step, the vessel may be opened if necessary to allow for separation and removal of some dice, or physical marking.

While the preferred embodiments of the invention have been described, modifications can be made and other embodiments may be devised without departing from the spirit of the invention and the scope of the appended claims.

What is claimed is:

1. A vessel for burning-in and testing of a semiconductor integrated circuit wafer having a plurality of dice, each die having a plurality of contact pads, which comprises:
   an upper plate;
   a lower plate;
   a printed circuit board (PCB) releasably attached to an undersurface of said upper plate;
   a plurality of electrically conductive pillars extending downwardly from an undersurface of said PCB;
   said pillars positioned to precisely contact said pads when said wafer and PCB are brought together in alignment;
   means for attaching said wafer to said lower plate;
   said upper plate sized and positioned to impart a substantially uniform vertical force across said PCB and thereby said pillars;
   said lower plate sized and positioned to impart a substantially uniform vertical force across said wafer;
   said upper plate being releasably held in a fixed position with respect to said lower plate;
   wherein both the upper plate and lower plate are comprised of a thermally conductive material for dissipating heat;
   a heating element integral with said lower plate; and
   wherein said vessel further comprises:
      a channel, bored through said lower plate, sized and dimensioned to accommodate gaseous or liquid coolant being circulated through said channel.

2. The vessel of claim 1 which further comprises a thermal sensor for monitoring the temperature of said wafer.

3. The vessel of claim 1, wherein said means for attaching said wafer to said lower plate comprise:
   an adhesive layer between said wafer and said lower plate.

4. The vessel of claim 3, wherein said adhesive layer provides an adhesion force on each of said dice which is weak enough to be overcome by vacuum pick-up of each of said dice.

5. The vessel of claim 4, wherein said adhesive layer provides said adhesion force in temperatures ranging from −55 to 125 degrees centigrade.

6. The vessel of claim 3, wherein said adhesive layer comprises sticky tape.

7. The vessel of claim 1, wherein said means for attaching said wafer to said lower plate comprise:
   a recess set into said lower plate sized and dimensioned to accommodate said wafer and to allow for thermal expansion of the wafer and vessel.

8. The vessel of claim 1, wherein said means for attaching said wafer to said lower plate comprise:
   a wafer saw carrier frame having said wafer releasably attached thereon; and
   said frame being releasably attached to said lower plate.

9. The vessel of claim 1, wherein each of said pillars is made from a material which comprises a conductive polymer epoxy.

10. The apparatus of claim 9, wherein said material further comprises a plurality of metal shavings mixed with said conductive polymer epoxy.

11. The apparatus of claim 10, wherein a subset of said metal shavings extends from a lower surface of each of said pillars to form a wiping surface for removing metal oxides from said pads.

12. The apparatus of claim 11, wherein said material is resilient enough to maintain electrical contact between each of said pads and said PCB during thermal expansion and contraction of said wafer and PCB.

13. The vessel of claim 1, which further comprises:
   electronic means for generating signals and power necessary to test said wafer.

14. A vessel for burning-in and testing of a semiconductor integrated circuit wafer having a plurality of dice, each die having a plurality of contact pads, said vessel comprises:
   an upper plate;
   a lower plate;
   means for electrically contacting a number of said contact pads;
   means for attaching said wafer to said lower plate;
   said upper and lower plates being comprised of a thermally conductive material for dissipating heat;
   means within said lower plate for heating said wafer; and
   a channel, bored through said lower plate, sized and dimensioned to accommodate gaseous or liquid coolant being circulated through said channel;
   wherein said means for electrically contacting comprise:
      a printed circuit board (PCB) attached to an undersurface of said upper plate;
      a plurality of electrically conductive pillars extending downwardly from an undersurface of said PCB; and
      said pillars being positioned to contact said number of said pads when said wafer and PCB are brought closely together in alignment;
   wherein said vessel further comprises:
      said upper plate being releasably held in a fixed position with respect to said lower plate;
      said upper plate being sized and positioned to impart a substantially uniform vertical force across said PCB and thereby said pillars;
      said lower plate being sized and positioned to impart a substantially uniform vertical force across said wafer;
      means for preventing lateral movement between the upper and lower plates;
      means for preventing said plates from coming apart; and
      means for preventing said plates from coming too close together.

15. The vessel of claim 14, wherein said means for preventing lateral movement comprise:
   at least two alignment guides extending from said lower plate, sized and dimensioned to slidingly engage holes in said upper plate.

16. The vessel of claim 15, wherein said means for preventing said plates from coming apart comprise:
   a fastener, one for each alignment guide, attachable to said alignment guide; and
   said fastener having a lower surface in contact with an upper surface of said upper plate, thereby preventing upward movement of said upper plate with respect to the alignment guides.

17. The vessel of claim 14, wherein said means for preventing the plate from coming too close together comprise:
   at least one spacer sized and dimensioned to contact a lower surface of said upper plate and an upper surface of said lower plate when the plates are brought together thereby preventing further movement of the upper plate toward the lower plate.

* * * * *